(12) United States Patent
Ishikawa

(10) Patent No.: US 7,472,049 B2
(45) Date of Patent: *Dec. 30, 2008

(54) DESIGN METHOD AND DESIGN SYSTEM FOR VEHICULAR LAMP, PROGRAM TO EXECUTE DESIGNING OF VEHICULAR LAMP AND RECORD MEDIUM RECORDING THE PROGRAM

(75) Inventor: Masahito Ishikawa, Shimizu (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 571 days.

This patent is subject to a terminal disclaimer.

(21) Appl. No.: 10/404,651

(22) Filed: Apr. 2, 2003

(65) Prior Publication Data

US 2003/0191613 A1    Oct. 9, 2003

(51) Int. Cl.
*G06G 7/48*    (2006.01)
(52) U.S. Cl. .......................................................... 703/8
(58) Field of Classification Search ...................... 703/8
See application file for complete search history.

(56) References Cited

U.S. PATENT DOCUMENTS

| | | | |
|---|---|---|---|
| 5,357,440 A | 10/1994 | Talbott et al. | |
| 5,940,308 A | 8/1999 | Ishikawa et al. | |
| 6,505,961 B2 | 1/2003 | Natsume | |
| 6,760,693 B1 * | 7/2004 | Singh et al. | 703/8 |
| 6,811,289 B2 | 11/2004 | Nakata | |
| 2003/0190614 A1 | 10/2003 | Morikawa et al. | |
| 2003/0191549 A1 | 10/2003 | Otsuka et al. | |

FOREIGN PATENT DOCUMENTS

| | | |
|---|---|---|
| JP | 4-081976 A | 3/1992 |
| JP | 6-231197 A | 8/1994 |
| JP | 7-182391 A | 7/1995 |
| JP | 2001-035215 A | 2/2001 |

(Continued)

OTHER PUBLICATIONS

Cooper et al.; Achieving competitive advantage through knowledge based engineering; pp. 1-17; 2001; A Best Practical Guide.*

(Continued)

*Primary Examiner*—Hugh Jones
(74) *Attorney, Agent, or Firm*—Sughrue Mion, PLLC

(57) ABSTRACT

Disclosed is to provide a design method and design system for a vehicular lamp, a program to execute designing of vehicular lamp and a record medium recording the program, which are capable of improving an efficiency of designing a lamp satisfying design conditions including performance conditions required as the vehicular lamp and restriction conditions given to each lamp. A vehicular lamp design system 1 includes: a database unit 2 having a standard database 21 registering standard data of a lamp and a technology database 22 registering technology data; and a lamp preparation unit 3 having a standard data selection part 31 and a morphing control part 32. The standard data selection part 31 generates design data by selecting standard data from the standard database 21 based on given design conditions. The morphing control part 32 updates a necessary part of the design data by use of the technology data of the technology database 22.

6 Claims, 13 Drawing Sheets

FOREIGN PATENT DOCUMENTS

| | | |
|---|---|---|
| JP | 2002-49647 A | 2/2002 |
| KR | 1999-009355 A | 2/1999 |
| KR | 2001-0055740 A | 7/2001 |

OTHER PUBLICATIONS

Wang F et al., "A conceptual approach managing design resource", Computers in Industry, Elsevier Science Publishers. Amsterdam, NL, vol. 47, No. 2, Feb. 2002, pp. 169-183, XP004334595.

Charlton C T et al., "A Web broker for component retrieval in mechanical engineering" Design Studies Elsevier UK, vol. 21, No. 2, Mar. 2000, pp. 167-186, XP002309342.

Bsharah F et al., "Requirements and strategies for the retention of automotive product data", Computer Aided Design, Elsevier Publishers BV., Barking, GB, vol. 32, No. 2, Feb. 2000, pp. 145-158, XP004188902.

Jenkins D et al., "Using computers to design nonimaging illumination systems", Proceedings of the SPIE—The International Society for Optical Engineering SPIE-Int. Soc. Opt. Eng USA, vol. 3130, 1997, pp. 196-203, XP002309343.

Kumar A et al., "Fully automated optical lens design for automotive lighting", Proceedings of the SPIE-The International Society for Optical Engineering SPIE-Int. Soc. Opt. Eng USA, vol. 3130, 1997, pp. 222-228, XP002309344.

Lie, Yucheng et al.; "Knowledge Based Design Wizard and Analysis of MSC.Acumen of Automotive Body"; Application Development of MSC and UGS Software; 2000; TJ Innova Engineering & Technology; Shanghai, The People's Republic of China.

Kochan, Anna; "Jaguar Uses Knowledge-based Tools to Reduce Model Development Times"; Assembly Automation; 1999; p. 114; vol. 19, Issue 2; Bedford, UK.

Japanese Office Action; 2002-102923; Sep. 22, 2006.

European Office Action for corresponding European Application No. 03007436.3 dated Dec. 13, 2007.

* cited by examiner

Fig. 11

| LIGHT TYPE 521 | PATTERN 522 | IMAGE | PRODUCT NAME 523 | DEVELOPMENT PERIOD | INFORMATION | SELECTION 525 |
|---|---|---|---|---|---|---|
| ⦿ NOT SPECIFIED<br>○ 2-LIGHT TYPE<br>○ 4-LIGHT TYPE<br>○ OTHER | ⦿ NOT SPECIFIED<br>○ IRREGULAR SHAPE TYPE<br>○ LATERALLY LONG SQUARE TYPE<br>○ CIRCLE TYPE<br>○ LONGITUDINALLY LONG SQUARE TYPE | | COMBINATION HEADLAMP ▶ | | | |
| 2-LIGHT TYPE | IRREGULAR SHAPE TYPE | | COMBINATION HEADLAMP | ○ MONTHS | ☐ ☐ ☐ | copy |
| 2-LIGHT TYPE | LATERALLY LONG SQUARE TYPE | | COMBINATION HEADLAMP | × MONTHS | ☐ ☐ ☐ | copy |
| 2-LIGHT TYPE | LATERALLY LONG SQUARE TYPE | | COMBINATION HEADLAMP | △ MONTHS | ☐ ☐ ☐ | copy |
| 2-LIGHT TYPE | CIRCLE TYPE | | COMBINATION HEADLAMP | ☐ MONTHS | ☐ ☐ ☐ | copy |
| 4-LIGHT TYPE | LONGITUDINALLY LONG SQUARE TYPE | | COMBINATION HEADLAMP | ☆ MONTHS | ☐ ☐ ☐ | copy |

52
52C

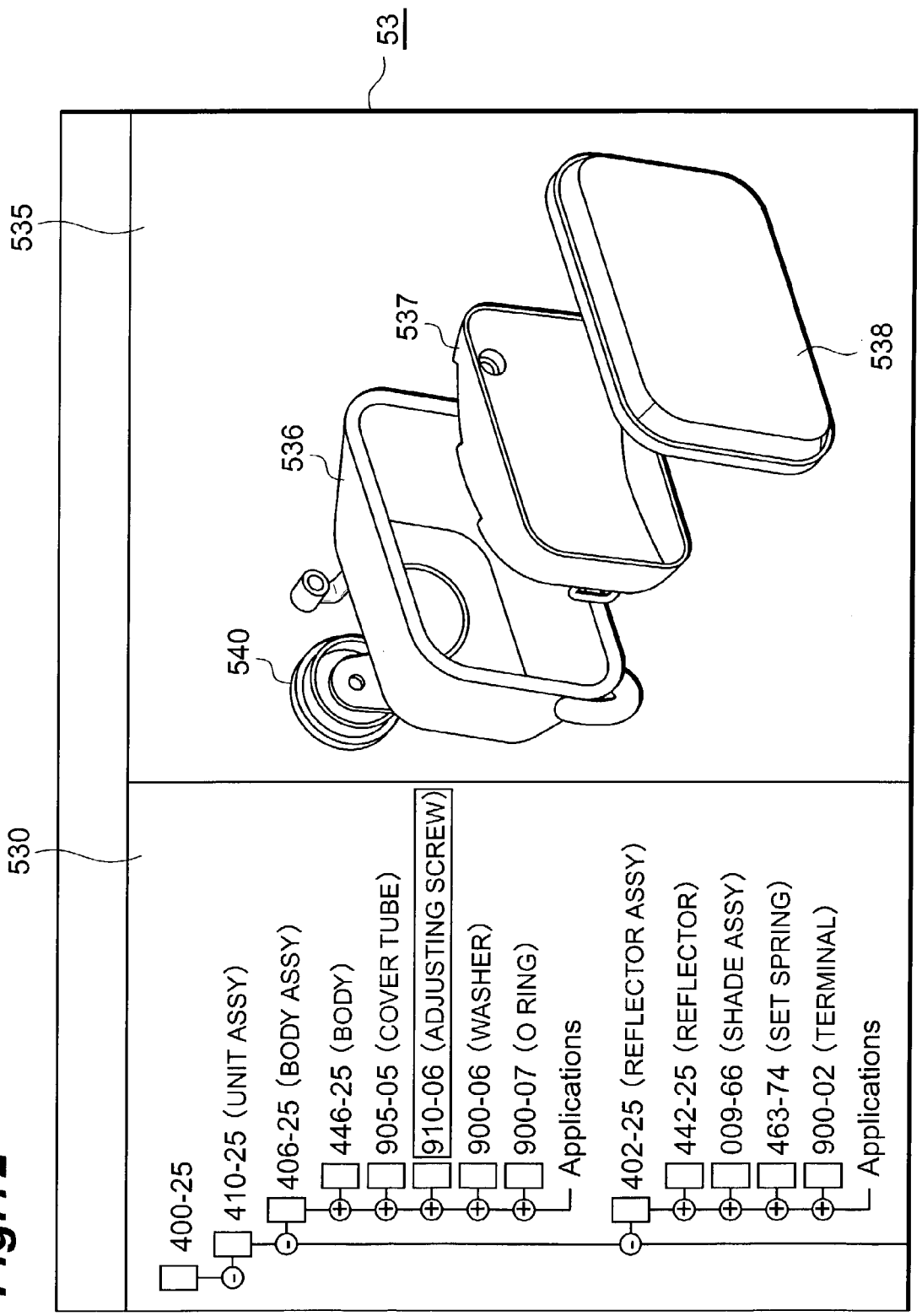

DESIGN METHOD AND DESIGN SYSTEM FOR VEHICULAR LAMP, PROGRAM TO EXECUTE DESIGNING OF VEHICULAR LAMP AND RECORD MEDIUM RECORDING THE PROGRAM

BACKGROUND OF THE INVENTION

1. Field of the Invention

The present invention relates to a design method and design system for a vehicular lamp used for vehicles such as an automobile and relates to a program for allowing a computer to execute designing of the vehicular lamp and a computer-readable record medium recording the program.

2. Related Background Art

Regarding a vehicular lamp, besides (1) conditions from aspects related to functions and performance as a lamp, because of its use in a state of being attached to a vehicle such as an automobile and the like, restriction conditions such as (2) conditions from aspects related to its shape (shape restriction conditions), (3) conditions from aspects related to its external appearance (appearance restriction conditions) and the like are imposed thereon. Therefore, in designing the lamp, it is required to realize a lamp in which the restriction conditions from given aspects of the shape and external appearance are satisfied and performance conditions thereof are optimized.

As the conditions from the aspect of performance, there are conditions from aspects of an optical performance such as a luminous intensity distribution pattern and the like, a structural performance, a thermal performance and the like, the conditions being required according to types of the lamp as the function of the vehicular lamp. Moreover, regarding the restriction conditions from the aspect of a car body, as the shape restriction conditions, there are conditions related to volume and shape of a lamp housing portion provided in the car body, to a shape of a lens outer surface of the lamp, the shape being continuous with other portions of the car body, and the like. Moreover, as the appearance restriction conditions, there are conditions related to a harmony between the external appearance thereof and an external appearance of the other portions of the car body, to a design of the car body and the like.

SUMMARY OF THE INVENTION

The restriction conditions upon designing, such as the shape and appearance restriction conditions and the like with respect to the vehicular lamp, are usually given as individual design conditions for every lamp according to the shape and external appearance designs of the car body using the lamp. Therefore, in designing such a lamp, it is necessary to consider the restriction conditions given to the lamp to be designed and to design the lamp so as to satisfy performance conditions necessary as the vehicular lamp regarding each performance such as the optical performance as to light emitted from the lamp.

Constitution, shape and the like of such a vehicular lamp are designed so as to satisfy the restriction conditions given thereto, while referring, to some degree, to necessary performance conditions such as a luminous intensity distribution pattern, for example, having certain light uniformity and light diffusion, as to a design procedure of the lamp. Then, for the designed lamp, the performance thereof is evaluated by performing a simulation of the luminous intensity distribution and the like. When the lamp does not satisfy the necessary performance conditions in the evaluation result, the lamp is redesigned by changing a part of the constitution, shape and the like of the evaluated lamp or by starting over the design of the lamp.

However, by use of such a design method, there is a problem that a design efficiency of the lamp is lowered due to the contents of the restriction conditions given to the lamp, a specific procedure used in the steps of designing or redesigning the lamp and the like. For example, when the constitution of the lamp designed so as to satisfy the restriction conditions from the aspect of the car body is depart from a constitution satisfying performance conditions necessary in the early stage, redesigning thereof is repeated many times until a lamp satisfying the performance conditions is finally obtained. Thus, the design efficiency of the lamp is significantly lowered.

The present invention is made in order to solve the above-described problems. It is the object of the present invention to provide a design method and design system for a vehicular lamp, a program for allowing a computer to execute designing of the vehicular lamp and a record medium recording the program, which are capable of improving a design efficiency of a lamp satisfying design conditions including performance conditions required as the vehicular lamp and restriction conditions given to each lamp.

In order to achieve the above-described object, the design method for a vehicular lamp according to the present invention is a method for designing a vehicular lamp, comprising: (1) a standard data selection step for generating design data by selecting one piece of standard data from a plurality of standard data registered in a standard database based on design conditions including a performance condition required as the vehicular lamp and a restriction condition given to each lamp; and (2) a morphing step of preparing lamp data satisfying the design conditions by updating a necessary part of the design data by use of technology data obtained from a technology database; wherein (3) the standard database is a database registering the plurality of standard data utilizable as source data of lamp designing, the standard data being prepared, respectively, in a predetermined data format having at least constitution data about a constitution of the lamp; and (4) the technology database is a database registering the technology data utilizable for the lamp designing.

Moreover, the design system for a vehicular lamp according to the present invention is a design system designing a vehicular lamp, comprising: (1) a standard database registering a plurality of standard data utilizable as source data of lamp designing, the standard data being prepared, respectively, in a predetermined data format having at least constitution data about a constitution of the lamp; (2) a technology database registering technology data utilizable for the lamp designing; (3) standard data selection means for generating design data by selecting one piece of standard data from the plurality of standard data registered in the standard database based on design conditions including a performance condition required as the vehicular lamp and a restriction condition given to each lamp; and (4) morphing control means for preparing lamp data satisfying the design conditions by updating a necessary part of the design data by use of the technology data obtained from the technology database.

Moreover, the program according to the present invention is a program for allowing a computer to execute designing of a vehicular lamp, being for allowing the computer to execute: (1) a standard data selection processing for generating design data by selecting one piece of standard data from a plurality of standard data registered in a standard database based on design conditions including a performance condition required as the vehicular lamp and a restriction condition given to each lamp; and (2) a morphing control processing for preparing lamp data satisfying the design conditions by updating a necessary part of the design data by use of technology data obtained from a technology database; wherein (3) the standard database is a database registering the plurality of standard data utilizable as source data of lamp designing, the standard data being prepared, respectively, in a predetermined data format having at least constitution data about a constitution of the lamp; and (4) the technology database is a database registering the technology data utilizable for the lamp designing.

The record medium according to the present invention is a computer-readable record medium recording a program for allowing a computer to execute designing of a vehicular lamp, the computer-readable record medium recording the program being for allowing the computer to execute: (1) a standard data selection processing for generating design data by selecting one piece of standard data from a plurality of standard data registered in a standard database based on design conditions including a performance condition required as the vehicular lamp and a restriction condition given to each lamp; and (2) a morphing control processing for preparing lamp data satisfying the design conditions by updating a necessary part of the design data by use of technology data obtained from a technology database; wherein (3) the standard database is a database registering the plurality of standard data utilizable as source data of lamp designing, the standard data being prepared, respectively, in a predetermined data format having at least constitution data about a constitution of the lamp; and (4) the technology database is a database registering the technology data utilizable for the lamp designing.

In the above-described design method and design system for a vehicular lamp, program to execute designing of vehicular lamp and record medium recording the program, regarding the design of the vehicular lamp, prepared are: the standard database registering the standard data for the entire constitution of the lamp; and the technology database registering the technology data for a part of the constitution thereof. Then, the lamp data are prepared by using the selected standard data as the source data and by referring to necessary technology data.

Here, the standard data, that is data of a standard lamp, is composed of lamp data of a standard lamp selected from lamps already designed, for example. Such a standard lamp is usually designed so as to satisfy performance conditions required as a vehicular lamp, such as a luminous intensity distribution pattern and the like. Meanwhile, as the technology data applied to the design data, technology data that can be suitably applied to the design data of the lamp are selected and registered. Therefore, by designing the lamp by utilizing the above-described standard data and technology data, it is made possible to improve the design efficiency of the lamp satisfying the design conditions including the performance conditions and the restriction conditions.

Moreover, the standard data registered in the standard database are prepared in a unified data format, and the lamp is designed by use of the prepared data as the design data. Thus, a preparation procedure of the lamp data taking the standard data as the source data is simplified. Moreover, adoption of the data format as described above is useful from the viewpoint of sharing of the lamp data among respective workers designing the lamp, manufacturing the lamp or the like, or from the viewpoint of utilization of the lamp data after the designing thereof. Moreover, the use of the technology data converted into a database as the data for updating the design data is also useful similarly from the viewpoint of the sharing and utilization of the lamp data.

BRIEF DESCRIPTION OF THE DRAWINGS

FIG. 11 is a view showing another example of a design screen for selecting the standard data.

FIG. 12 is a view showing one example of a design screen for confirming or updating design data.

DESCRIPTION OF THE PREFERRED EMBODIMENTS

Figure 1:
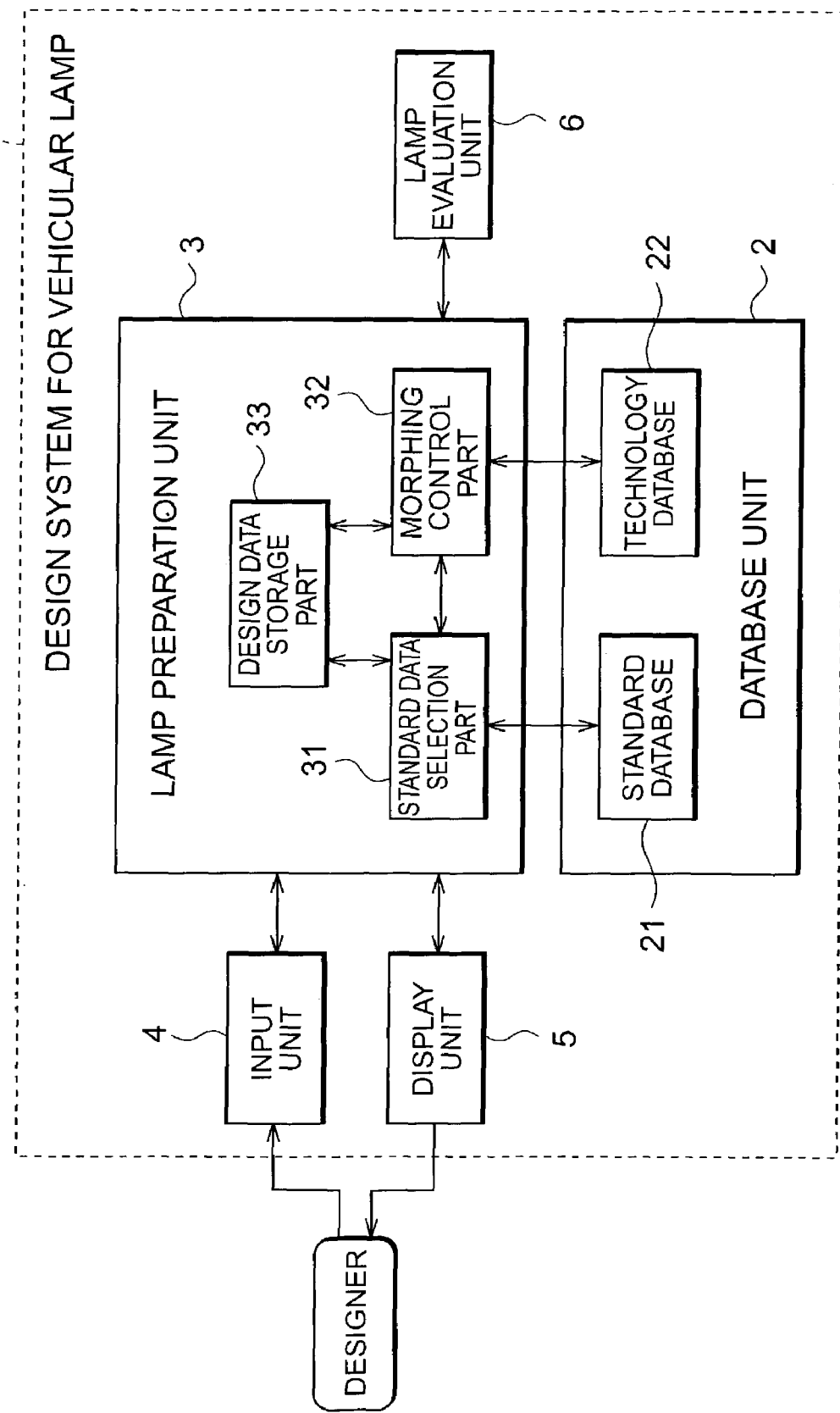
FIG. 1 is a block diagram showing a constitution of a design system of a vehicular lamp according to one embodiment.

Hereinafter, detailed description will be made with reference to the drawings for preferred embodiments of a design method and design system for a vehicular lamp, a program for allowing a computer to execute designing of the vehicular lamp and a computer-readable record medium recording the program according to the present invention. Note that, in the description of the drawings, the same constituent components are denoted by the same reference numerals and thus repetitive description thereof will be omitted. Moreover, dimensional ratios of the drawings do not necessarily coincide with those in the description.

FIG. 1 is a block diagram showing a constitution of one embodiment of a design system of a vehicular lamp according to the present invention. This vehicular lamp design system 1 is a design system for preparing lamp data based on design conditions given to a vehicular lamp to be designed, the system being constituted of a database unit 2, a lamp preparation unit 3, an input unit 4 and a display unit 5.

The database unit 2 is a data storage unit storing data used for preparing the lamp data in this design system 1. In this embodiment, two kinds of database, including a standard database 21 and a technology database 22, are prepared in the database unit 2. The standard database 21 is a database registering a plurality of standard data utilizable, respectively, as source data of the lamp data prepared in lamp designing. Moreover, the technology database 22 is database registering technology data utilizable in the lamp designing in which final lamp data satisfying the design conditions are prepared.

The lamp preparation unit 3, by use of the data stored in the database unit 2 and the like, prepares the lamp data based on an instruction from a designer or by an automatic processing. This lamp preparation unit 3 has a standard data selection part 31, a morphing control part 32 and a design data storage part 33.

The standard data selection part 31 selects one piece of standard data suitable for the lamp from the plurality of standard data registered in the standard database 21, based on the design conditions for the lamp to be designed. Then, by use of the selected standard data, the design data used for preparing the lamp data are generated.

The morphing control part 32 performs morphing for the generated design data according to need. Specifically, as to a necessary part of the design data generated from the standard data, a part of or all of the design data are updated by using the technology data obtained from the technology database 22 and by performing modifications of the data, such as a change in the constitution of the lamp, a change in shape thereof and the like. Thus, the lamp data satisfying the design conditions are prepared.

Moreover, the design data generated from the standard data selected by the standard data selection part 31 and the design data partially or entirely updated by the morphing control part 32 are stored in the design data storage part 33. The stored data are referred to or updated according to need.

The input unit 4 and the display unit 5 are provided for the lamp preparation unit 3 preparing the lamp data based on the given design conditions, in order to exchange necessary information between the designer designing the lamp and the lamp preparation unit 3 of the design system 1. The input unit 4 is input means used by the designer to input information related to the designing of the lamp to the lamp preparation unit 3. Moreover, the display unit 5 is display means for displaying information referred to in the designing of the lamp from the lamp preparation unit 3 to the designer.

To be specific, the designer can instruct, via the input unit 4, the standard data selection part 31 of the lamp preparation unit 3 to select one piece of standard data to be the design data from the plurality of standard data registered in the standard database 21. In this event, the input unit 4 functions as selection instruction means of the standard data. Moreover, the designer can instruct, via the input unit 4, the morphing control part 32 of the lamp preparation unit 3 to update a necessary part of the design data generated from the standard data. In this event, the input unit 4 functions as update instruction means of the design data.

Meanwhile, the display unit 5 functions as the display means for displaying, by use of the lamp preparation unit 3, a design screen showing necessary information to the designer. For example, regarding the selection of the standard data, the display unit 5 displays a selection design screen showing the plurality of standard data registered in the standard database 21. Alternatively, regarding the obtainment of the technology data, the display unit 5 displays a technology design screen showing the technology data registered in the technology database 22. Alternatively, regarding the update of the design data, the display unit 5 displays an update design screen showing the design data to be updated by use of the technology data.

Moreover, in the design system 1 of this embodiment, a lamp evaluation unit 6 is provided for the foregoing lamp preparation unit 3. As to the lamp data such as the design data generated in the standard data selection part 31 of the lamp preparation unit 3, the design data updated in the morphing control part 32, the lamp evaluation unit 6 performs evaluation of the lamp based on the instruction from the designer or by an automatic processing. Specifically, the lamp evaluation unit 6 evaluates whether or not the lamp to be designed satisfies the given design conditions.

Figure 2:
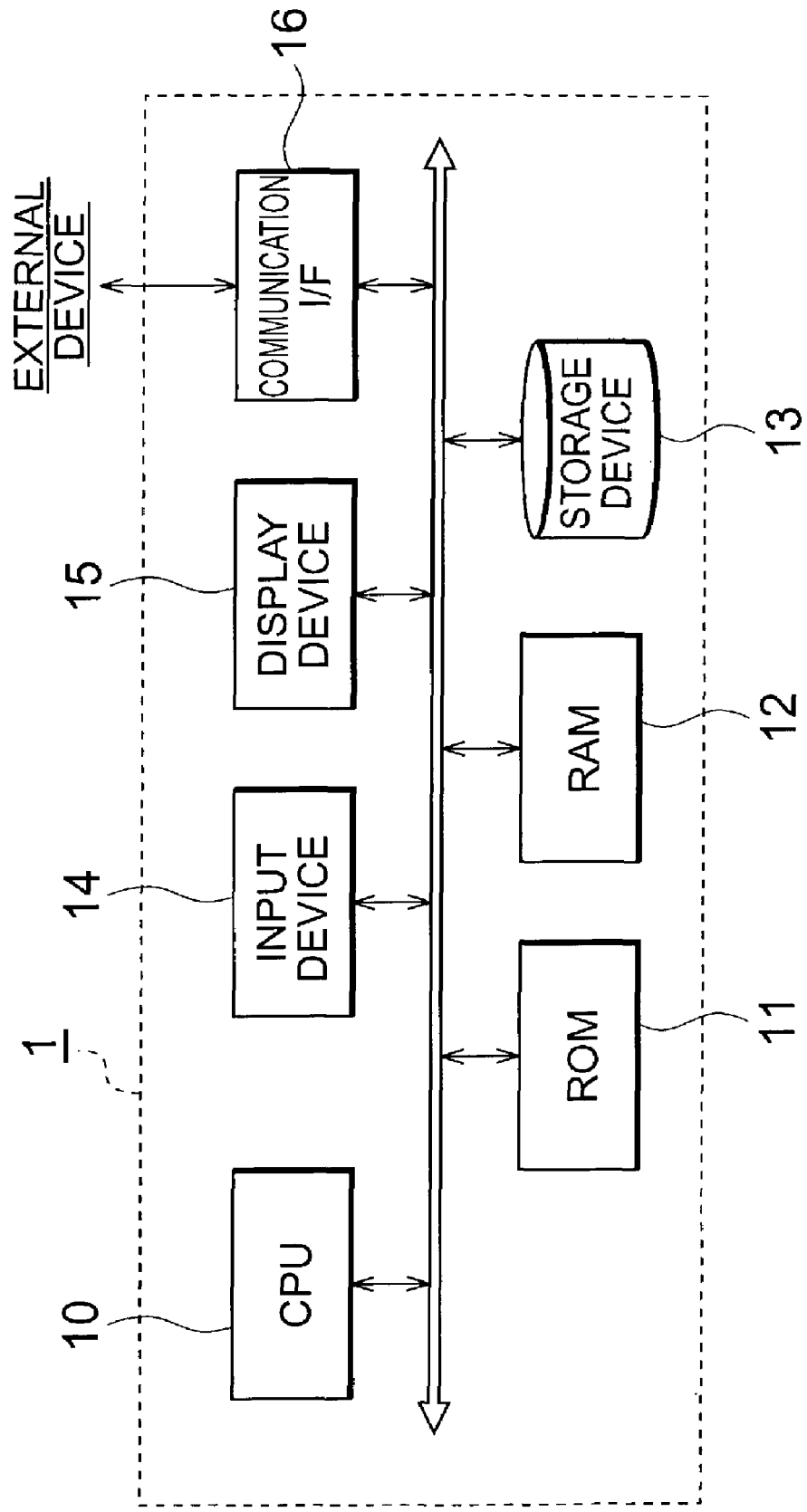
FIG. 2 is a block diagram showing one example of a hardware configuration used in the design system of the vehicular lamp shown in FIG. 1.

FIG. 2 is a block diagram showing one example of a hardware configuration used in the design system of the vehicular lamp shown in FIG. 1. Software processing activities in the design system 1 shown in FIG. 1 and processing corresponding to respective steps in the design method for a vehicular lamp, which is performed by this design system 1, are feasible by a program for allowing a computer to execute designing of the vehicular lamp. Specifically, the software processing activities include: the selection of the standard data and the generation of the design data in the standard data selection part 31; the update of the design data in the morphing control part 32; the reception of the input from the input unit 4; the instruction of the display to the display unit 5; and the like. In other words, these software processing activities are carried out, for example, by a CPU 10 executing the program for designing the vehicular lamp in the hardware configuration shown in FIG. 2.

To the CPU 10, connected are: a ROM 11 storing respective software programs necessary for processing operations of the design system 1; and a RAM 12 temporarily storing data during execution of the program. Moreover, to the CPU 10, an external storage device 13, such as a hard disc and the like, is connected. This external storage device 13 is used as a storage device storing respective data such as the data stored in the database unit 2 including the standard database 21 and the technology database 22, the design data stored in the design data storage part 33 and the like.

To the above-described devices such as the CPU 10, an input device 14 corresponding to the input unit 4 of FIG. 1 and a display device 15 corresponding to the display unit 5 are connected. Thus, the vehicular lamp design system 1 of this embodiment is constituted. As the input device 14, for example, a pointing device such as a mouse, a keyboard or the like is used. Moreover, as the display device 15, a CRT display, a liquid crystal display or the like is used. Moreover, when it is necessary to exchange the lamp data and the like between the design system 1 and an external device used by another designer or the like, a communication I/F 16 is provided for connection to the external device.

Moreover, the foregoing designing program for allowing the CPU 10 to execute the respective processing for designing the vehicular lamp is distributable by being recorded in a computer-readable record medium. Such a record medium includes, for example: a magnetic medium such as a hard disc, a floppy disk and the like; an optical medium such as a CD-ROM, a DVD-ROM and the like; a magneto-optical medium such as a floptical disk and the like; a hardware device such as, for example, a RAM, a ROM, a semiconductor nonvolatile memory and the like, which is specially disposed so as to execute or store program instructions; and the like. Moreover, a drive for reading recording media (for example, a floppy disk drive and the like) that reads the program and the like from the record medium described above may be connected to the CPU 10.

Figure 3:
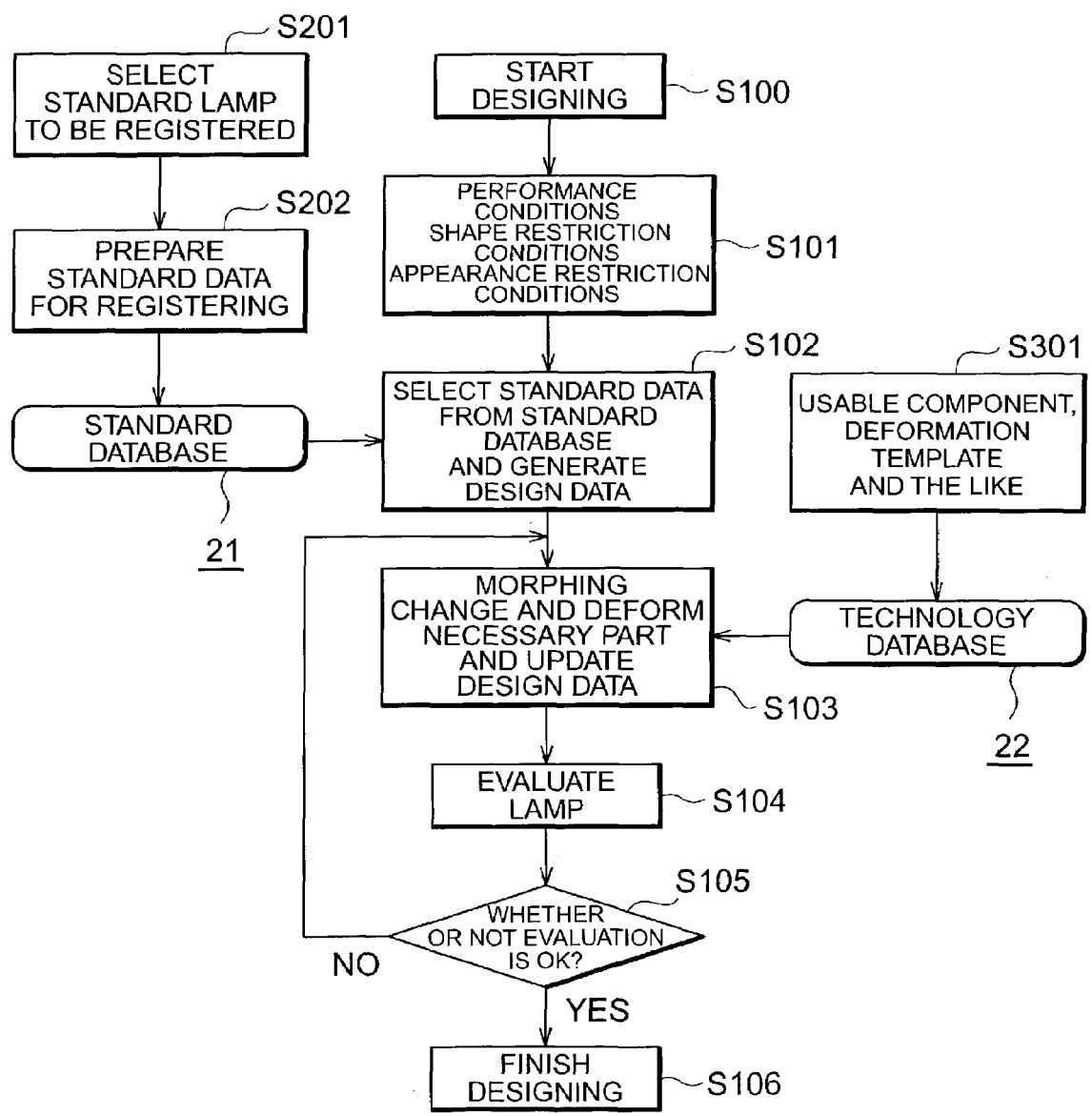
FIG. 3 is a flowchart schematically showing one embodiment of a method for designing the vehicular lamp.

FIG. 3 is a flowchart schematically showing one embodiment of the design method for a vehicular lamp according to the present invention. With reference to the constitution of the design system 1 shown in FIG. 1, the design method for a vehicular lamp will be described below.

First, the standard database 21 and the technology database 22 will be described, which are prepared in the database unit 2 as the data used in preparing the lamp data in the design system 1. These databases 21 and 22 are prepared prior to the designing of the lamp and stored in the database unit 2 of the design system 1.

In the standard database 21, the plurality of standard data that can be used as the source data of the lamp data to be prepared in designing the lamp are stored. In preparation of the standard database, constitutions, shapes, external appearances, performances, manufacturing costs and the like of designed lamps, which are already designed or commercialized, are examined. Then, among those designed lamps, a lamp considered to be appropriate to be used as a model of designing the lamp is selected, thus obtaining a standard lamp (Step S201).

Next, for the selected standard lamp, standard data including information about a constitution thereof and the like, which are necessary upon designing thereof, is prepared (S202). These standard data are to be lamp data for registering to the standard database 21. Moreover, the standard data are prepared by use of a predetermined data format having at least constitution data about the constitution of the standard lamp.

Meanwhile, in the technology database 22, stored is technology data that can be utilized as data for updating the design data by changing the constitution of the lamp, components, shape, materials and the like in the designing of the lamp. As such technology data, for example, there are; data of components that can be used in the lamp; data of a template for changing shapes of respective parts of the lamp; and the like (S301). Note that detailed description will be made for the standard data registered in the standard database 21 and for the technology data registered in the technology database 22.

Next, description will be made for the design method for a vehicular lamp, which utilizes the data stored in the standard database 21 and the technology database 22. First, according to an order from a client and the like, designing of a vehicular lamp is started (Step S100). In this event, to a lamp to be designed, design conditions, which are conditions that should be satisfied by the lamp, are given (S101). These design conditions include performance conditions and restriction conditions.

The performance conditions are conditions required from the aspects of functions and performance as the vehicular lamp. As specific performance conditions, there are conditions for: optical performance such as a luminous intensity distribution pattern required depending on the type of the lamp as functions of the vehicular lamp; structural performance such as a structural strength of the lamp and the like; thermal performance such as heat resistance in the state of turning on the lamp; and the like.

Moreover, the restriction conditions are conditions given from the aspect of the car body and the like as design conditions for each lamp. As specific restriction conditions, as shape restriction conditions from the aspect of shape thereof, there are conditions for: volume and shape of a lamp housing portion provided in the car body; a shape of a lens outer surface of the lamp, the shape being continuous with other portions of the car body; and the like. Moreover, as appearance restriction conditions from the aspect of external appearance thereof, there are conditions for: a harmony between the external appearance thereof and an external appearance of the other portions of the car body; a design of the car body; and the like.

Based on the design conditions including the performance conditions required as the vehicular lamp and the restriction conditions given to each lamp, the plurality of standard data registered in the standard database 21 are examined, respectively, and one piece of standard data, which will be used as the source data for designing the lamp, is selected from the standard data (S102, a standard data selection step).

By referring to the contents of the design screen displayed on the display unit 5, the designer selects standard data from the standard database 21, the standard data being suitable as the source data for preparing lamp data. Then, via the input unit 4, the designer instructs the standard data selection part 31 of the lamp preparation unit 3 about the standard data to be selected. Based on the contents of the input from the input unit 4, the standard data selection part 31 reads out the instructed standard data from the standard database 21, generates design data used for preparing the lamp data and stores the design data in the design data storage part 33.

Next, the design conditions and constitution and performance of the generated design data are examined, and necessary technology data are obtained from the technology database 22. Then, a necessary part of the design data is updated by use of the obtained technology data, and the lamp data satisfying the design conditions are prepared (S103, a morphing step).

With reference to the contents of the design screen displayed on the display unit 5, the design conditions for the lamp to be designed, and the like, the designer instructs the morphing control part 32 of the lamp preparation unit 3 to update the design data via the input unit 4 by utilizing the technology data stored in the technology database 22 according to need. Based on the contents of the input from the input unit 4, the morphing control part 32 reads out the instructed technology data from the technology database 22, performs morphing of the data, updates a necessary part of the design data and stores the updated data in the design data storage part 33.

Subsequently, for the lamp data prepared by the selection of the standard data, the generation and the updating of the design data, all of which are carried out by the lamp preparation unit 3, the lamp evaluation unit 6 evaluates performance of the lamp and the like (S104). Then, based on the obtained evaluation results, it is determined whether or not the lamp according to the prepared lamp data satisfies the design conditions given to the lamp (S105). If the design conditions are satisfied, the design data at the point is taken as final lamp data, thus finishing the designing of the lamp (S106). On the other hand, if the design conditions are not satisfied, the design procedure such as the updating of the design data and the like is repeated.

Description will be made for effects of the a design method and design system for a vehicular lamp, a program to execute designing of vehicular lamp and a record medium recording the program according to the above-described embodiment.

In the design system 1 and the design method for the vehicular lamp, which are shown in FIGS. 1 and 3, the program used therein and the record medium used therein, regarding the designing of the vehicular lamp, the standard database 21 registering the standard data about the entire constitution of the lamp and the technology database 22 registering the technology data about the partial constitution of the lamp are prepared in the database unit 2. Then, by using the standard data selected from the standard database 21 as the source data and by referring to the necessary technology data among the data in the technology database 22, the lamp data are prepared by the lamp preparation unit 3.

Here, the standard data, that are data of a standard lamp, are, for example, composed of lamp data of a standard lamp selected from lamps already designed. Such a standard lamp is usually designed so as to satisfy performance conditions required as a vehicular lamp, such as a luminous intensity distribution pattern and the like. Therefore, by converting the above-described standard data into database to be the standard database 21 and utilizing the same as the source data of designing the lamp, it is made possible to improve the design efficiency of the lamp satisfying the design conditions including the performance conditions and the restriction conditions.

Moreover, as the technology data applied to the design data, for example, technology data, which are already used for another lamp and can be suitably applied to the design data of the lamp, and the like are selected. Therefore, such technology data are converted into database to be the technology database 22 and is utilized as the data for designing the lamp. Thus, together with the foregoing standard data, it is made possible to improve the design efficiency of the lamp satisfying the design conditions.

Moreover, the standard data registered in the standard database 21 are prepared by use of a uniform data format, and the lamp is designed by using the data format in the design data. Furthermore, as data for updating the design data, the technology data prepared in the technology database 22 so as to correspond to the data format of the standard data and design data are used. Accordingly, regardless of the type of the standard lamp selected as a model of the lamp and specific updated contents of the lamp data, confirmation, updating and the like of the design data can be performed by taking a similar procedure. Thus, the preparation procedure of the lamp data satisfying the design conditions is simplified.

Moreover, the adoption of the data format as described above is useful from the viewpoint of sharing the lamp data among respective workers designing the lamp, manufacturing the lamp or the like, or from the viewpoint of utilization of the lamp data after the designing thereof. For example, by preparing the lamp data corresponding to the lamp, which is already designed or is being designed, in a uniform data format, the respective workers can refer to or utilize the lamp data.

Moreover, in the design system 1 shown in FIG. 1, for the lamp preparation unit 3, provided are: the display unit 5 functioning as the display means for displaying design screens and the like, which show the plurality of standard data registered in the standard database 21; and the input unit 4 functioning as the selection instruction means for instructing the selection of the standard data and as the update instruction means for instructing the updating of the design data. By providing the above-described input unit 4 and display unit 5, the designer performing the designing of the lamp can efficiently carry out respective design procedures of the lamp designing with reference to the design screen displayed on the display unit 5.

Figure 4:
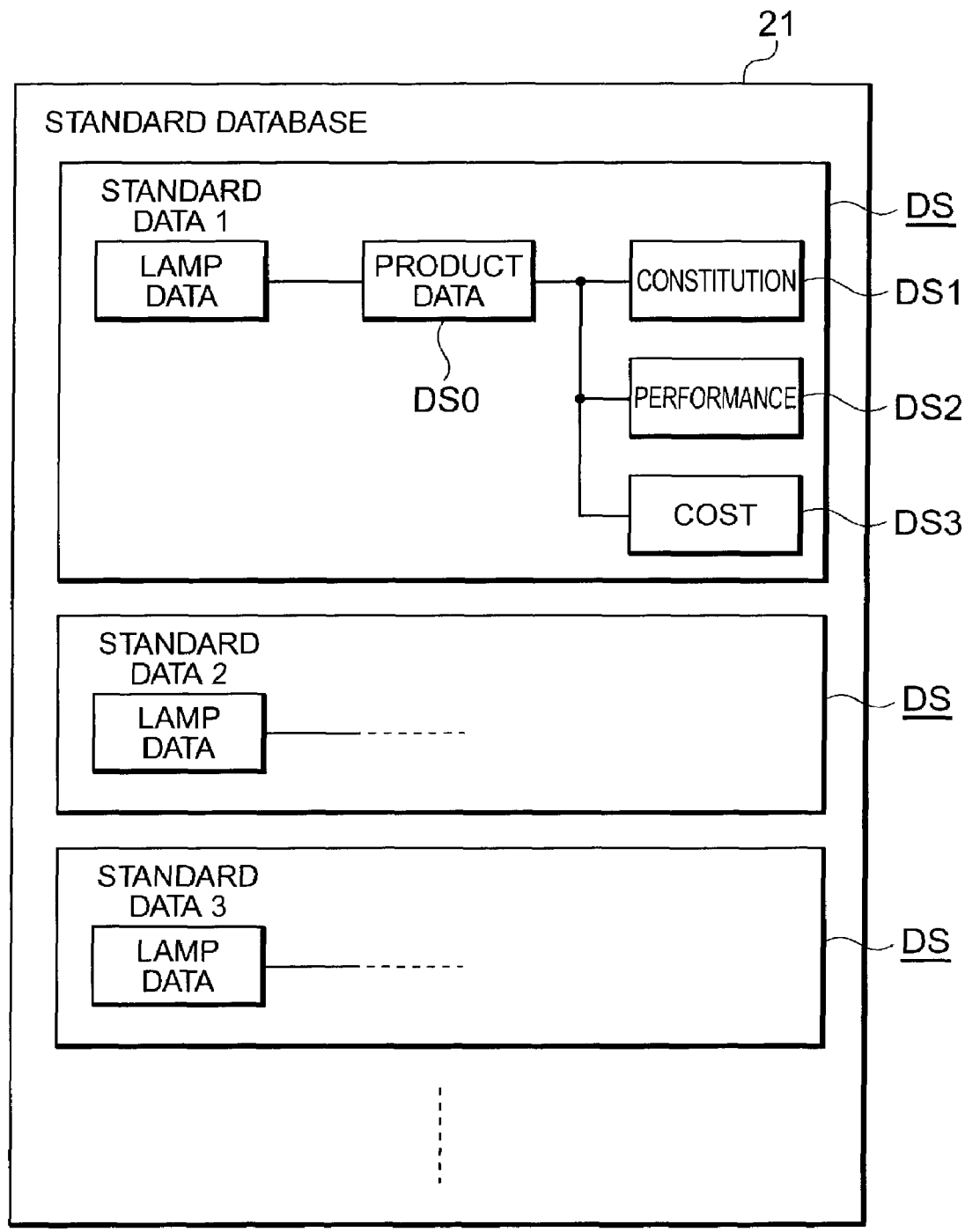
FIG. 4 is a schematic view showing one example of a data format of standard data registered in a standard database in the design system of the vehicular lamp shown in FIG. 1.

The standard data of the lamp, which is registered in the standard database 21 in the vehicular lamp design system 1 shown in FIG. 1, will be described in detail. FIG. 4 is a schematic view showing one example of a data format of the standard data registered in the standard database in the design system of the vehicular lamp shown in FIG. 1.

In the standard database 21, as shown in FIG. 4, a plurality of standard data DS, which can be used as source data for preparing lamp data, respectively, are registered. These standard data DS are composed of lamp data prepared in a predetermined data format as data corresponding to a standard lamp selected from designed lamps.

In the data format shown in the example of FIG. 4, the lamp data of the standard data DS are composed of product data DS0 that are data about a product itself of the lamp. Moreover, these product data DS0 are constituted by having three kinds of data including: constitution data DS1 about a constitution of the lamp; performance data DS2 about performance of the lamp; and cost data DS3 about manufacturing costs in manufacturing the lamp.

Figure 5:
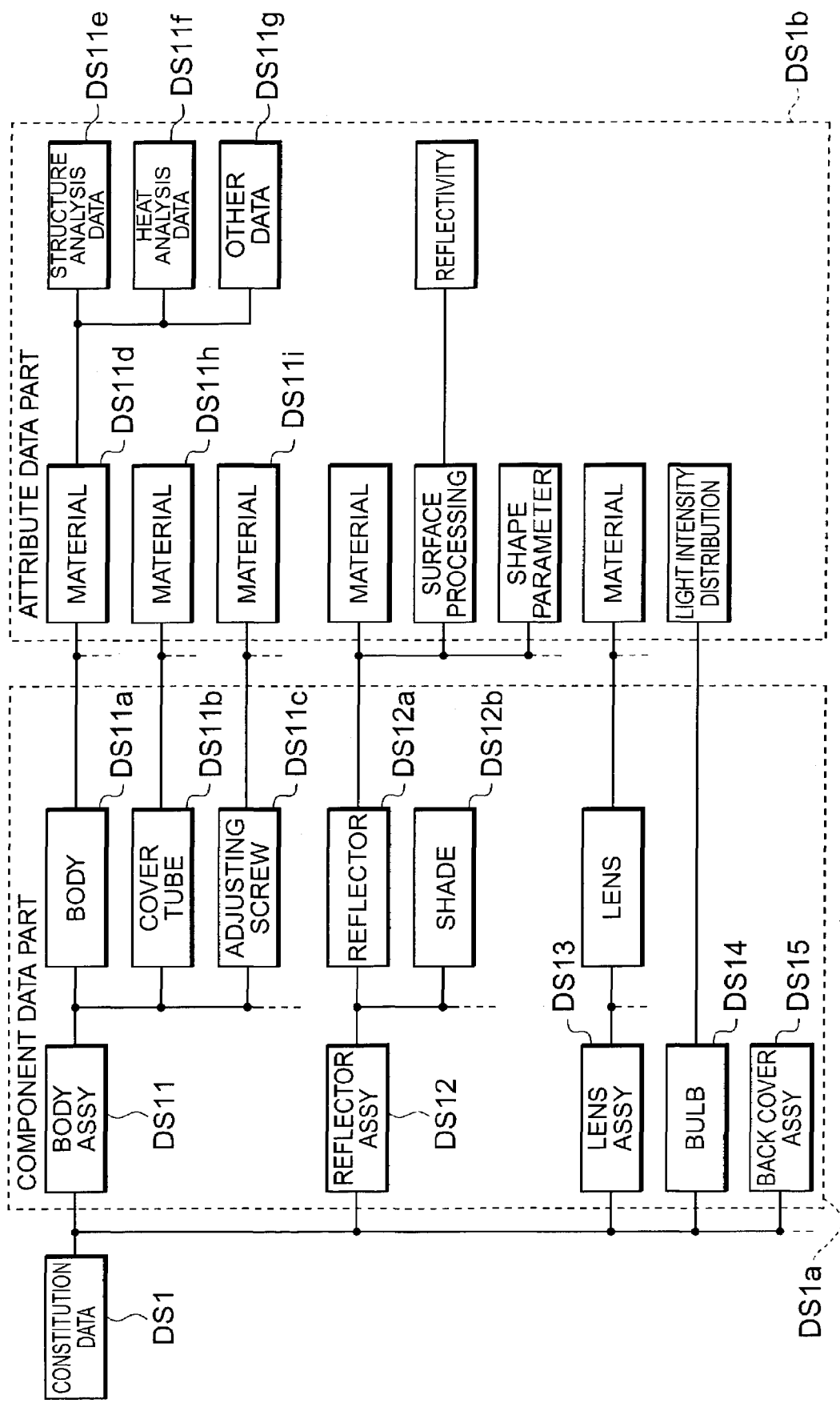
FIG. 5 is a schematic view showing one example of a data format of constitution data in the standard data shown in FIG. 4.

FIG. 5 is a schematic view partially showing one example of a data format of the constitution data in the standard data shown in FIG. 4. The constitution data DS1 are prepared in a data format of a hierarchical type, having: a component data part DS1$a$ including necessary data about components used for the standard lamp; and an attribute data part DS1$b$ including necessary data about attributes of the components in the component data part DS1$a$.

In the example shown in FIG. 5, the component data part DS1$a$ has: body assembly data DS11 about a component constitution of a body portion of the lamp; reflector assembly data DS12 about a component constitution of a reflector portion; lens assembly data DS13 about a component constitution of a lens portion such as an inner lens, an outer lens or the like; bulb data DS14 about components of a light source bulb; and back cover assembly data DS15 about a component constitution of a rear cover portion.

Moreover, among these component data DS11 to DS15, as to the component data that are not the data of the components themselves but are the data of the component constitutions, there further exist component data, respectively, as low-order data thereof. In FIG. 5, for example, the body assembly data DS11 has, as low-order component data thereof, body data DS11$a$, cover tube data DS11$b$ and adjusting screw data DS11$c$. Moreover, the reflector assembly data DS12 has reflector data DS12$a$ and shade data DS12$b$.

For the above-described component data included in the component data part DS1$a$, attribute data about the attributes of the components in the respective component data are prepared in the attribute data part DS1$b$.

For example, when checking attribute data, that is low-order data for the body assembly data DS11 in the component data part DS1$a$, among the attribute data in the attribute data part DS1$b$, for the body data DS1$a$, the cover tube data DS11$b$ and the adjusting screw data DS11$c$, material data DS11$d$, DS11$h$ and DS11$i$ about component materials as the attributes thereof are prepared, respectively. Specifically, the body data DS11$a$, the cover tube data DS11$b$ and the adjusting screw data DS11$c$ are the component data constituting the body.

Moreover, for the body data DS11$a$, in addition to the material data DS11$d$, structure analysis data DS11$e$, heat analysis data DS11$f$ and other data DS11$g$ are prepared as low-order attribute data thereof. Moreover, also for the respective component data DS12 to DS15 other than the body assembly data DS11, necessary attribute data are similarly prepared in the attribute data part DS1$b$.

Figure 6:
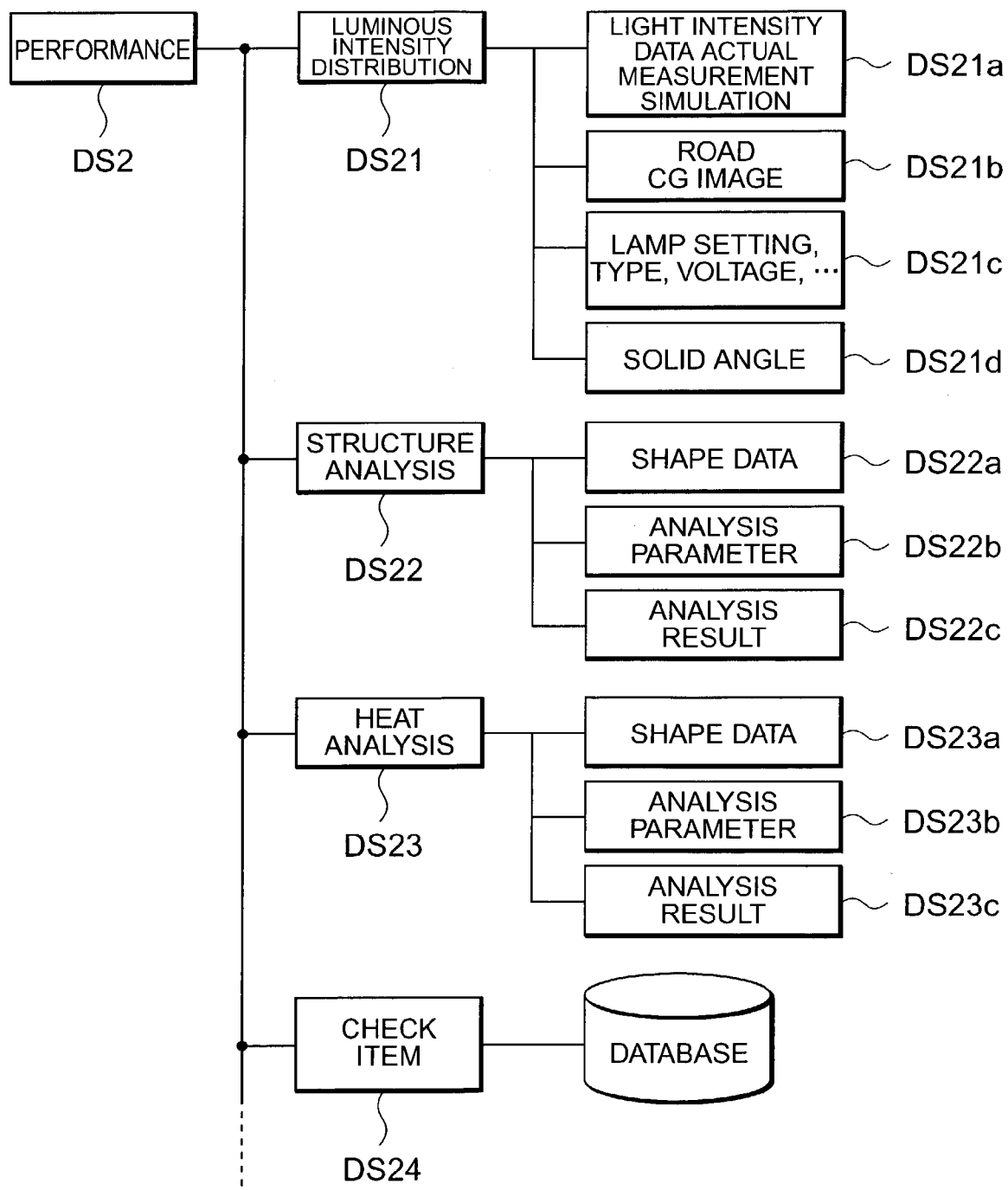
FIG. 6 is a schematic view showing one example of a data format of performance data in the standard data shown in FIG. 4.

FIG. 6 is a schematic view partially showing one example of a data format of the performance data in the standard data shown in FIG. 4.

In the example shown in FIG. 6, the performance data DS2 has: luminous intensity distribution data DS21 about optical performance of a lamp, such as a luminous intensity distribution pattern of emitted light and the like; structure analysis data DS22 about structural performance such as a structural strength of the lamp and the like; heat analysis data DS23 about thermal performance such as heat resistance of the lamp; and check item DS24 showing check contents about the lamp and the like.

Moreover, for these performance data, specific data related to the respective performance data are prepared as low-order data.

For example, for the luminous intensity distribution data DS21, light intensity data DS21$a$, road surface CG image data DS21*b*, lamp setting data DS21*c* and solid angle data DS21*d* are prepared as low-order performance data thereof. Moreover, for the structure analysis data DS22, shape data DS22*a*, analysis parameter data DS22*b* and analysis result data DS22*c* are prepared. Moreover, for the heat analysis data DS23, shape data DS23*a*, analysis parameter data DS23*b* and analysis result data DS23*c* are prepared.

In data examples shown in FIGS. 4 to 6, the standard data DS is prepared in a data format having the performance data DS2 about the performance of the lamp in addition to the constitution data DS1 about the constitution of the lamp. Thus, in the designing of the lamp, the performance of the standard lamp as the source of the design data can be referred to.

Moreover, in the case where the performance of the lamp is evaluated after the necessary part of the design data are updated, the performance thereof can be efficiently evaluated by utilizing the performance data DS2 prepared together with the constitution data DS1 in the standard data DS. For example, in the performance data DS2 shown in FIG. 6, the performance data such as the shape data DS22*a* and DS23*a*, the analysis parameter data DS22*b* and DS23*b*, all of which are prepared for the structure analysis data DS22 and the heat analysis data DS23, or the like can be utilized in the performance evaluation in the designing of the lamp.

Moreover, the constitution data DS1 of the standard data DS is, as shown in FIG. 5, prepared in a data format of a hierarchical type, having: the component data part DS1*a* having the component data about the components used for the lamp; and the attribute data part DS1*b* having the attribute data about the attributes of the components. Thus, in the designing of the lamp, the information about the standard lamp, which includes the attributes such as the materials of the components used for the lamp, can be sufficiently utilized.

Moreover, the attribute data as described above can be also utilized for the performance evaluation of the lamp. For example, in the constitution data DS1 shown in FIG. 5, the structure analysis data DS11*e* and the heat analysis data DS11*f*, which are prepared for the body data DS11*a*, can be utilized in the structure analysis and the heat analysis of the lamp, together with the structure analysis data DS22 and the heat analysis data DS23, which are prepared in the performance data DS2. As the structure analysis data DS11*e* of the structure data DS1, for example, a specific gravity, a tensile strength, a flexural strength and the like are prepared. Moreover, as the heat analysis data DS11*f*, for example, a thermal conductivity, a specific heat, a volume expansion rate and the like are prepared.

Note that the data format of the standard data DS shown in FIGS. 4 to 6 is similarly used in the design data of the lamp, which are generated by the standard data selected from the standard database 21 and updated according to need. For example, in the case of updating the design data having the data format shown in FIGS. 4 to 6, the design data can be updated by changing a necessary data part of the respective data included in the design data.

Moreover, in the updating of the design data as described above, update history data are preferably added to the updated data part of the design data. Thus, the designer, workers other than the designer, who refer to the design data, or the like can confirm updated points and contents of the design data from the standard data. Such update history data can be also utilized, for example, in performance evaluation of the lamp by use of the design data after being updated. Moreover, in the case where the lamp data thus prepared is newly selected to be the standard data and registered in the standard database 21, the previous update history data may be added to the standard data.

As to the above-described addition of the update history data to the design data or the standard data, for example, in the case of changing the adjusting screw used for the body assembly in the constitution data DS1 shown in FIG. 5, the update history data can be added to the adjusting screw data DS11*c*. Alternatively, apart from the constitution data DS1 and the performance data DS2, the update history data for the entire design data or standard data may be prepared in a lump.

Moreover, for the check item data DS24 of the performance data DS2, which show the check contents necessary for the lamp, database showing proposed measures corresponding to the respective check contents may be provided together with the data of the check contents. In this case, the updating procedure in the case of further updating the design data based on the result of checking the lamp is simplified.

Next, detailed description will be made for the technology data registered in the technology database 22 in the vehicular lamp design system 1 shown in FIG. 1 and for the design method using the same.

In this technology database 22, as described above, the technology data used in the lamp designing, in which the lamp data satisfying the design conditions are prepared, is registered. As such technology data, various data can be prepared as long as the data are utilizable in the lamp designing.

Specifically, as the technology data, the technology database 22 preferably has standard component data utilizable as the component data of the lamp in the design data. As described above, by changing the components of the lamp by use of the standard component data prepared in advance, the lamp data can be efficiently prepared. Moreover, by designing the lamp data by use of the standard component data, a lamp that can be easily manufactured at low costs by utilizing the standard components can be obtained.

Moreover, as the technology data, the technology database 22 preferably has a shape template utilizable as shape data of the lamp in the design data. As described above, by changing shapes of the respective parts of the lamp by use of the shape template prepared in advance, the lamp data can be efficiently prepared similarly to the standard component data.

Here, as the standard component data registered in the technology database 22, specifically, there are, for example, data corresponding to the respective component data shown in the component data part DS1*a* in the constitution data DS1 of FIG. 5 (for example, the adjusting screw data, the bulb data and the like).

Figure 7:
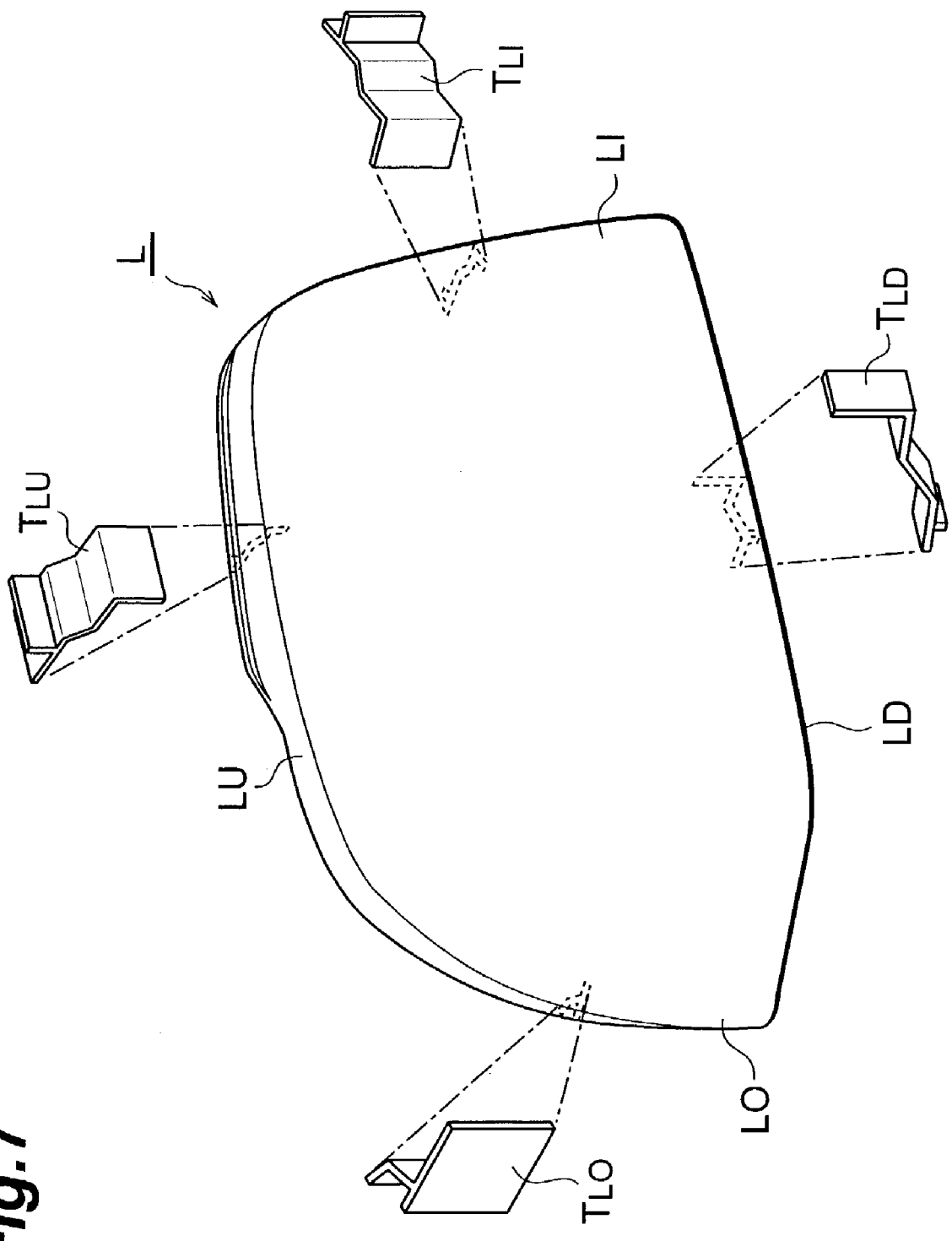
FIG. 7 is a view showing one example of a shape template for a seal leg of a lens.

Moreover, as the shape template, specifically, there are, for example, data about a shape and the like of a seal leg of lens (see FIG. 7). The seal leg constituting an outer peripheral portion of the lens is a portion likely to be affected by the restriction conditions such as the design of the lamp and the like. For designing of the shape of such a portion, a deformable shape template is previously prepared as the technology data. Thus, the lamp data conforming to the restriction conditions can be efficiently prepared.

Note that, in FIG. 7, as an example of the shape template for the seal leg of the lens, shape templates $T_{LU}$, $T_{LD}$, $T_{LI}$ and $T_{LO}$ for the seal leg at the upper-side surface LU, lower-side surface LD, inner surface LI and outer surface LO of the lens L, respectively, are shown.

Figure 8:
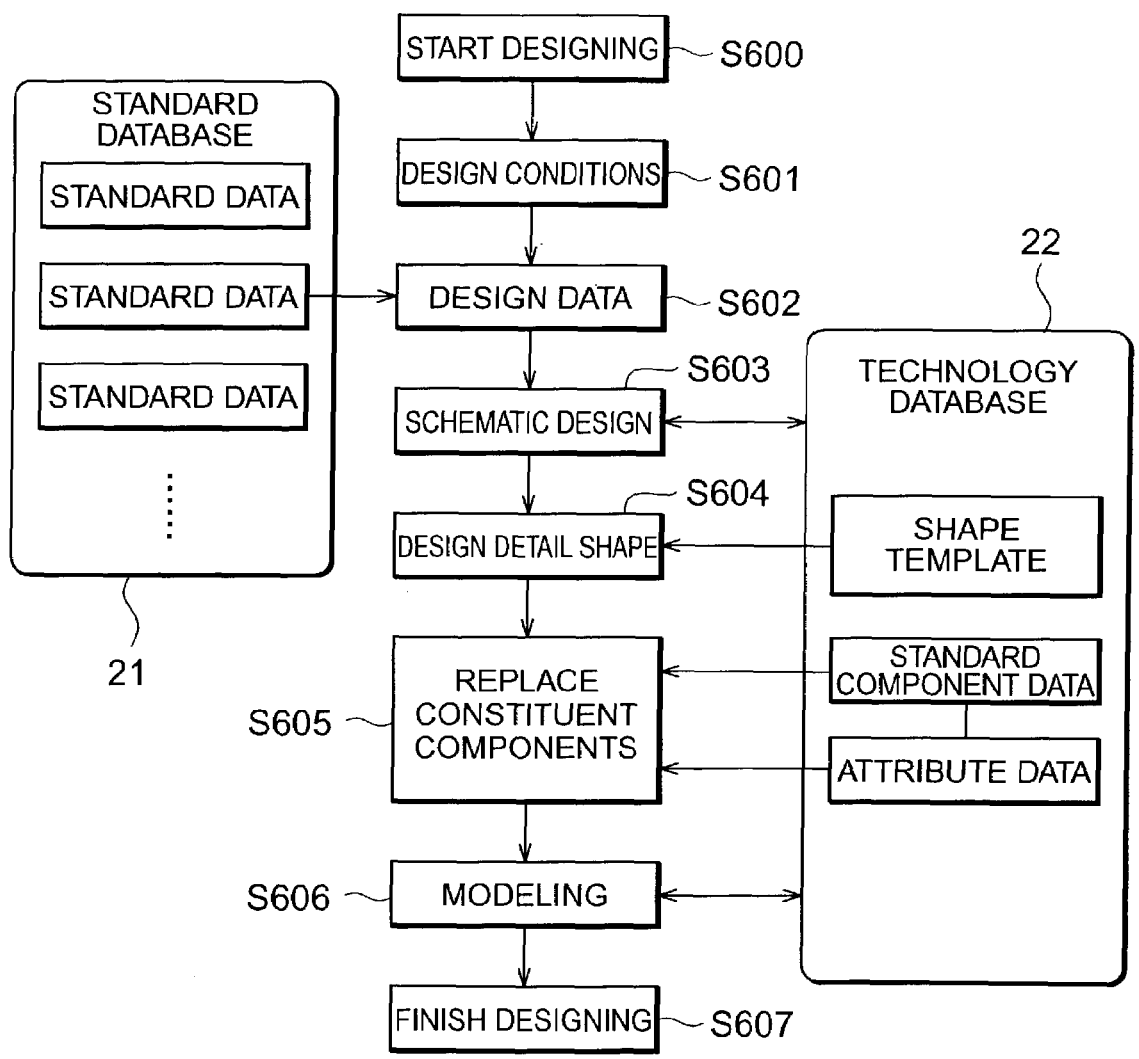
FIG. 8 is a flowchart showing one example of the design method for the vehicular lamp in the case of using a technology database having standard component data and the shape template.

FIG. 8 is a flowchart showing one example of the design method of a vehicular lamp in the case of using the technology database having the standard component data and the shape templates.

First, designing of the vehicular lamp is started (Step S600), and design conditions including performance and restriction conditions that should be satisfied by the lamp are given to the lamp to be designed (S601). Based on these design conditions, suitable standard data are selected as source data from the plurality of standard data registered in the standard database 21, thus generating design data (S602).

Next, for the generated design data, a schematic constitution of the lamp satisfying the design conditions is designed (S603, a schematic design step). Herein, by referring to shape and appearance restriction conditions from the aspect of the car body and the like, an exterior design of the lamp is schematically determined. After the schematic constitution of the lamp is designed, designing of a detail shape is performed for the shape data that requires deformation in the obtained design data, by referring to the shape templates registered in the technology database 22 (S604, a detail design step) For example, as to the shape data of the seal leg of the lens, of which exterior design is determined, a suitable shape template is obtained from the technology database 22, a shape template to be applied thereto and a shape thereof are changed, and thus the shape of the seal leg is designed.

Subsequently, for the design data to which the designing of the detail shape is performed, replacement of the constituent components is performed (S605, a component design step). For the respective component data included in the constitution data of the design data, it is examined whether or not the components need to be changed. Then, for the component data that need to be changed, suitable standard component data are obtained from the technology database 22 and the component data are updated. In this event, when attribute data are added to the standard component data in the technology database 22, the corresponding attribute data are also updated together with the component data.

After the updating of the necessary data part related to the shape and components of the lamp is finished, overall modeling including a mold, a manufacturing facility and the like is performed for the prepared lamp data (S606). Then, if there is no problem, the designing of the lamp is finished (S607).

As described above, with respect to the design data used in designing the lamp, the lamp is designed by taking the design procedure including: the schematic design step of designing the schematic constitution of the lamp; the detail design step of designing the detail constitution by updating the shape data of the lamp; and the component design step of designing the component constitution by updating the component data of the lamp. Accordingly, the necessary data parts as to the shape and components of the lamp in the design data are updated, respectively, and thus the lamp data conforming to the design conditions can be suitably prepared.

Figure 9:
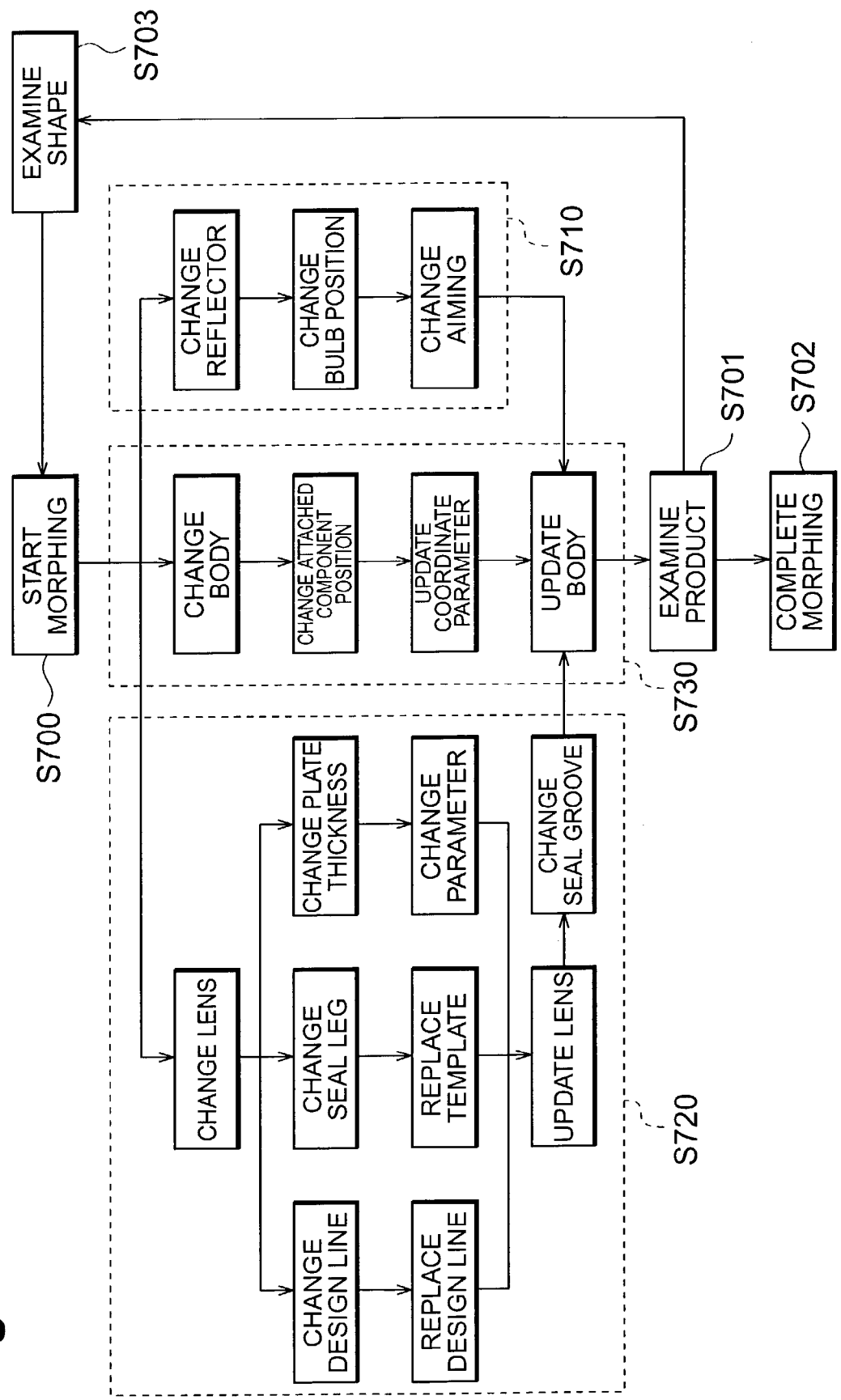
FIG. 9 is a flowchart showing another example of the design method for the vehicular lamp in the case of using the technology database.

FIG. 9 is a flowchart showing another example of the design method for a vehicular lamp in the case of using the technology database. FIG. 9 shows the flowchart of designing when focusing attention on the respective constituent parts and components of the lamp.

First, after generating design data by selecting standard data for the lamp to be designed, morphing of the design data are started for respective parts such as reflector, lens, body and the like of the lamp (Step S700).

As to the morphing of the reflector (S710), constitution and shape of the reflector, which include an exterior shape thereof and a shape of a reflecting surface with respect to a light source bulb, are changed, and a change in a bulb position, a change of aiming and the like are performed. Moreover, as to the morphing of the lens (S720), constitution and shape of the lens, which include an exterior shape thereof and a lens step, are changed, and change and replacement of a design line, a change of the seal leg, replacement or deformation of the foregoing shape template, a change of a plate thickness, a parameter change and the like are performed. Thereafter, the lens is updated and a seal groove is changed.

Moreover, as to the morphing of the body (S730), constitution and shape of the body are changed, and positional changes of attached components, updating of a coordinate parameter and the like are performed. Thereafter, the body is updated. Note that, in the updating of the body, the body is updated taking also into consideration the influence of the updated contents of the reflector and the lens on the body.

After finishing the updating of necessary data parts for the respective parts such as the reflector, the lens, the body and the like, examination of a product as the vehicular lamp is carried out for the obtained design data (S701). If there is no problem, the morphing is completed (S702). Alternatively, the obtained design data are subjected to morphing again after carrying out shape examination (S703).

Next, description will be made for the design screen displayed on the display unit 5 in the vehicular lamp design system 1 shown in FIG. 1.

In the design system 1 shown in FIG. 1, for the designer performing designing of the lamp, the input unit 4 as the input means for inputting information related to the designing of the lamp and the display unit 5 as the display means for displaying information referred to in the designing of the lamp are provided. The designer can prepare the lamp data while exchanging information between the designer and the lamp preparation unit 3 via the above-described input unit 4 and display unit 5.

For example, in the design procedure of the vehicular lamp, as shown in the flowchart of FIG. 3, the designer refers to the design conditions given to the lamp to be designed and selects the standard data used as the source data of designing the lamp from the plurality of standard data registered in the standard database 21. In this event, a selection design screen showing the plurality of standard data registered in the standard database 21 as options of the design data is displayed on the display unit 5 of the design system 1. Thus, the designer can efficiently perform selection of the standard data by referring to contents displayed on the design screen.

Figure 10:
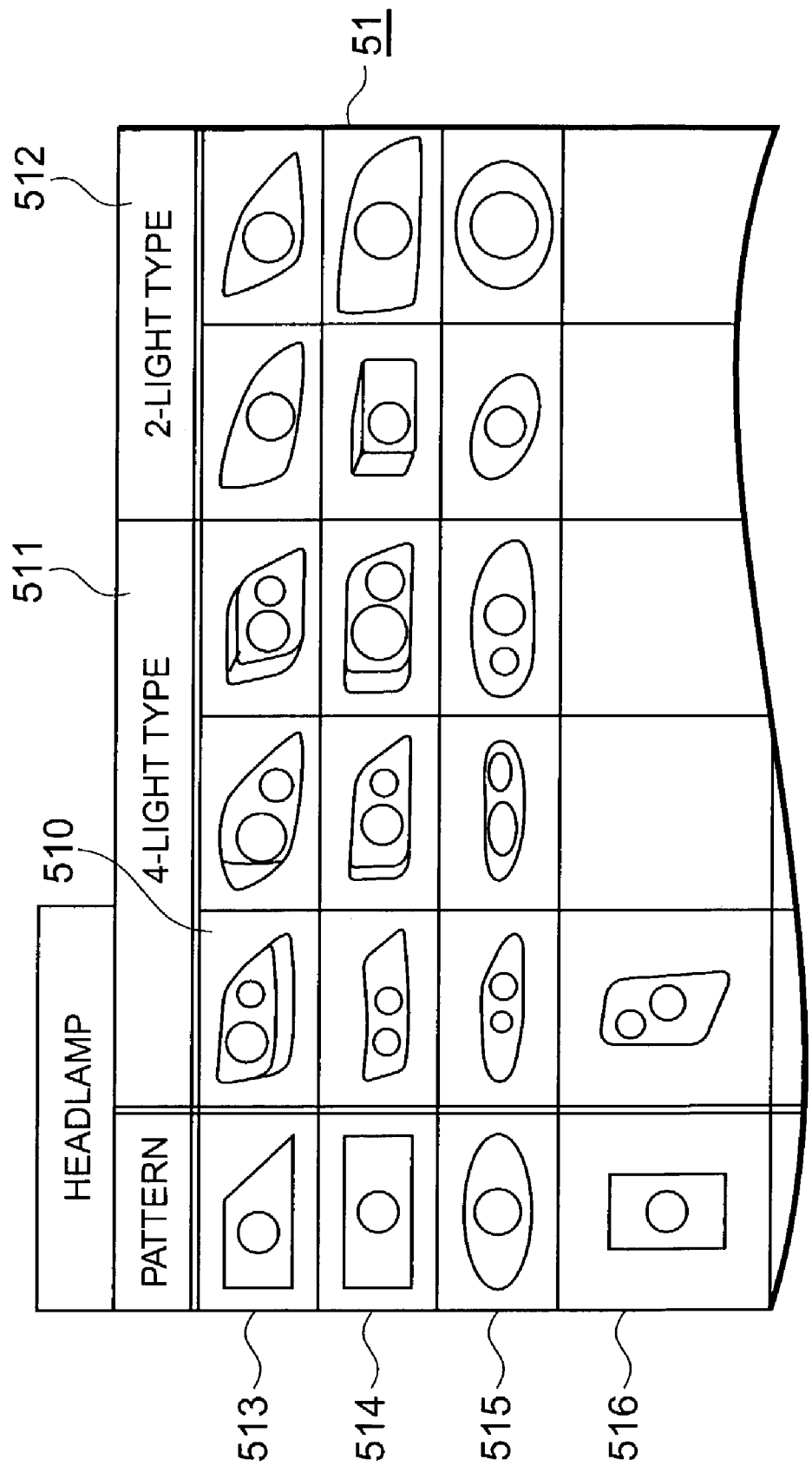
FIG. 10 is a view showing one example of a design screen for selecting the standard data.

FIG. 10 is a view showing one example of the design screen displayed on the display unit 5 for the selection of the standard data. This design screen 51 shows a selection design screen displayed when performing designing of a headlamp as the vehicular lamp.

In this design screen 51, the horizontal direction of the screen 51 is divided into a 4-light type section 511 and a 2-light type section 512 in accordance with the light type of the headlamp. Moreover, in accordance with pattern shapes of the headlamp, the vertical direction of the screen 51 is divided into: a irregular shape type section 513; a laterally long square type section 514; a circle type section 515; and a longitudinally long square type section 516. Then, in respective item sections 510, images of standard lamps corresponding to standard data, which are categorized according to these light types and pattern shapes, are displayed. The designer can refer to the contents displayed on the design screen 51 and can select the standard data used in the designing from the standard data shown in the item sections 510, respectively.

FIG. 11 is a view showing another example of the design screen displayed on the display unit 5 for the selection of the standard data. This design screen 52 shows a selection design screen displayed when performing the designing of the headlamp, similarly to that of FIG. 10.

In this design screen 52, the vertical direction of the screen 52 is divided into a plurality of sections, and the respective sections serve as item sections 520 displaying the standard data. Moreover, in the respective item section 520, display sections such as a light type display section 521, a pattern display section 522, an image display section 523 and the like are provided. The designer can refer to the contents displayed on the design screen 52 and can select the standard data used in the designing from the standard data shown in the item sections 520, respectively, by use of a selection instruction section 525.

Moreover, in the design procedure of the vehicular lamp, besides the selection of the above-described standard data, the designer, as shown in the flowchart of FIG. 3, refers to the given design conditions, makes a confirmation as to design data generated from the selected standard data and updates a part of or all of the design data according to need. In this event, if an update design screen showing the contents of the design data at respective time points of the lamp designing is displayed on the display unit 5 of the design system 1, the designer can refer to the contents displayed on the design screen and can confirm and update the design data efficiently.

FIG. 12 is a view showing one example of a design screen displayed on the display unit 5 for confirming or updating the design data.

In this design screen 53, the left side thereof is a data display part 530, and the right side thereof is an image display part 535. In the data display part 530, contents of design data having the data formats shown in FIGS. 4 to 6 are displayed along with hierarchical structure thereof. Moreover, in the image display part 535, an image showing a structure of a lamp corresponding to the design data are displayed.

In the example shown in FIG. 12, in the image display part 535 displaying the image of the lamp, displayed are: a body assembly 536 corresponding to the body assembly data DS11 in the constitution data DS1 (see FIG. 5); a reflector assembly 537 corresponding to the reflector assembly data DS12 therein; a lens assembly 538 corresponding to the lens assembly data DS13 therein; and a back cover assembly 540 corresponding to the back cover assembly data DS15 therein.

According to the design screen 53 as described above, the designer can refer to the contents displayed on the design screen 53, can confirm the contents of the design data at the respective time points of the lamp designing from the data shown in the data display part 530 and the image display part 535, respectively, or can instruct updating of a necessary data part.

Moreover, in the case of updating a part of the design data, as shown in FIG. 12, it is preferable to display the design data so as to make the updated part of the data identifiable. In the example of FIG. 12, for the adjusting screw of which the constituent component has been replaced, component data are displayed by adding a frame surrounding a component number and a component name. Thus, the updated part of the data is made identifiable.

Moreover, in the design procedure of the vehicular lamp, as shown in the flowchart of FIG. 3, the designer obtains the technology data registered in the technology database 22 and utilizes the same in updating the necessary part of the design data. In this event, if a technology design screen showing the technology data registered in the technology database 22 is displayed on the display unit 5 of the design system 1, the designer can refer to the contents displayed on the design screen and can efficiently obtain the technology data.

Figure 13:
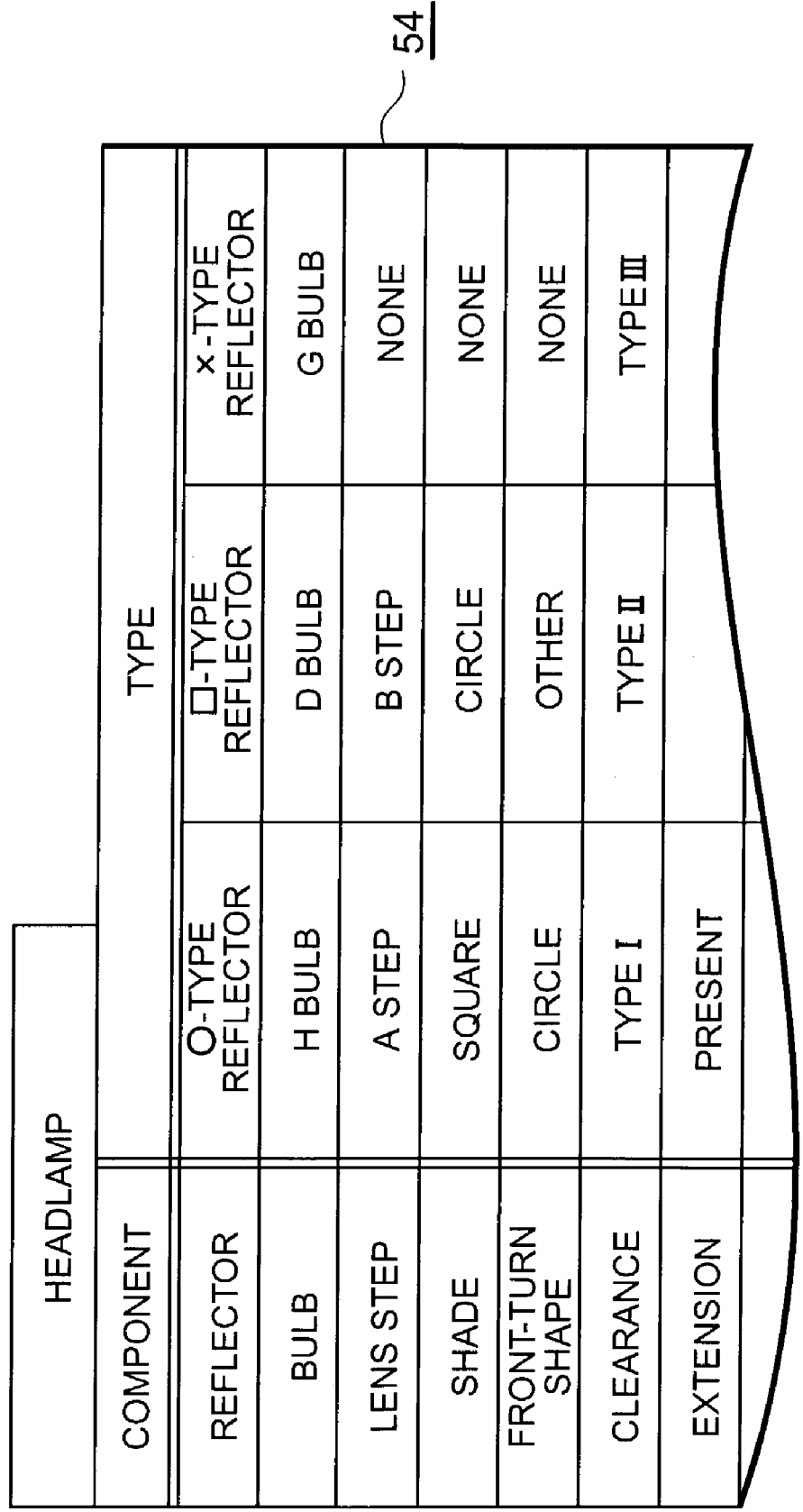
FIG. 13 is a view showing one example of a design screen for obtaining the technology data.

FIG. 13 is a view showing one example of a design screen displayed on the display unit 5 for obtaining the technology data.

In this design screen 54, the vertical direction of the screen 54 is divided into a plurality of sections, and plural types of the technology data are displayed in the respective sections. The designer can refer to the contents displayed on the design screen 54 and can select technology data used for designing from the technology data shown in the respective sections. Note that, also for technology data such as shape templates and the like, a similar design screen can be used.

The design method and design system for a vehicular lamp, program for allowing a computer to execute designing of the vehicular lamp and computer-readable record medium recording the program according to the present invention are not limited to the above-described embodiment but various changes thereof are possible. For example, in the design system 1 shown in FIG. 1, when it is unnecessary to perform the performance evaluation of the lamp and the like in the design system, the design system may have a constitution having no lamp evaluation unit 6 provided therein.

Moreover, as to the data format of the standard data of the lamp in the standard database 21, the above-described data format is one example thereof, and thus a data format other than the above may be used. For example, in the case where the performance of the lamp can be easily derived from the constitution data, a data format having no performance data may be adopted. Moreover, as to the contents of the technology data registered in the technology database 22, the above-described standard component data and shape templates are examples thereof, and thus technology data other than the above-described may be used as long as the data are utilizable for the lamp designing.

As described above in detail, the design method and design system for a vehicular lamp, program for allowing a computer to execute designing of the vehicular lamp and computer-readable record medium recording the program according to the present invention achieve effects as below. Specifically, in the design method, design system and the like, the standard database registering the standard data utilizable as the source data of the lamp designing and the technology database registering the technology data utilizable for the lamp designing are prepared in advance and the design data are generated by selecting one piece of standard data from the standard database, a necessary part of the design data are updated by using the technology data from the technology database, and thus the lamp data satisfying the design conditions is prepared. According to the above-described method and system, a design method and design system and the like for a vehicular lamp are realized, which can improve an efficiency of designing a lamp satisfying design conditions including performance conditions required as the vehicular lamp and restriction conditions given to each lamp.

What is claimed is:

1. A design system for a vehicular lamp, comprising:
    a standard database registering a plurality of standard data utilizable as source data for lamp designing, the standard data being prepared, respectively, in a predetermined data format having at least constitution data about a constitution of the lamp;
    a technology database registering technology data utilizable for the lamp designing;
    standard data selection means for generating design data by selecting one piece of standard data from the plurality of standard data registered in said standard database based on design conditions including a performance condition required for the vehicular lamp and a restriction condition given to each lamp; and
    morphing control means for preparing lamp data satisfying the design conditions by updating a necessary part of the design data by use of the technology data obtained from said technology database.

2. The design system for a vehicular lamp according to claim 1, further comprising:
   display means for displaying at least one of a design screen showing the plurality of standard data registered in said standard database, the design screen showing the technology data registered in said technology database and the design screen showing the design data updated by use of the technology data;
   selection instruction means for instructing the standard data selection means to select from the plurality of standard data one piece of standard data to be the design data; and
   update instruction means for instructing the morphing control means to update the necessary data part of the design data.

3. The design system for a vehicular lamp according to claim 1, wherein the technology data in the technology database has standard component data utilizable as component data of the lamp in the design data.

4. The design system for a vehicular lamp according to claim 1, wherein the technology data in the technology database has a shape template utilizable as shape data of the lamp in the design data.

5. The design system for a vehicular lamp according to claim 1, wherein said morphing control means adds update history data to an updated data part of the design data.

6. The design system for a vehicular lamp according to claim 1, wherein the performance condition comprises a luminous intensity distribution.

* * * * *